(12) United States Patent
Deng et al.

(10) Patent No.: US 11,931,993 B2
(45) Date of Patent: Mar. 19, 2024

(54) BONDING METHOD AND BONDING DEVICE FOR FLEXIBLE PANEL

(71) Applicants: Chengdu BOE Optoelectronics Technology Co., Ltd., Chengdu (CN); BOE Technology Group Co., Ltd., Beijing (CN)

(72) Inventors: Jia Deng, Beijing (CN); Jialin Wang, Beijing (CN); Rongkun Fan, Beijing (CN); Shengqiang Wu, Beijing (CN); Xue Meng, Beijing (CN); Yuanhong Wen, Beijing (CN); Senlin Ma, Beijing (CN); Chaoxue Qin, Beijing (CN); Peng Wang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/639,151

(22) PCT Filed: Feb. 2, 2021

(86) PCT No.: PCT/CN2021/074935
§ 371 (c)(1),
(2) Date: Feb. 28, 2022

(87) PCT Pub. No.: WO2021/196875
PCT Pub. Date: Oct. 7, 2021

(65) Prior Publication Data
US 2022/0314591 A1 Oct. 6, 2022

(30) Foreign Application Priority Data
Mar. 31, 2020 (CN) .......................... 202010242264.3

(51) Int. Cl.
*B32B 41/00* (2006.01)
*B32B 3/04* (2006.01)
(Continued)

(52) U.S. Cl.
CPC .............. *B32B 37/003* (2013.01); *B32B 3/04* (2013.01); *B32B 17/06* (2013.01);
(Continued)

(58) Field of Classification Search
CPC ......... B32B 37/003; B32B 3/04; B32B 17/06; B32B 37/1284; B32B 37/22; B32B 41/00;
(Continued)

(56) References Cited

U.S. PATENT DOCUMENTS

| 2017/0087807 A1* | 3/2017 | Lee ............................. B32B 7/12 |
| 2017/0263492 A1 | 9/2017 | Son et al. |
| 2019/0009500 A1 | 1/2019 | Tovar |

FOREIGN PATENT DOCUMENTS

| CN | 203573052 U | 4/2014 |
| CN | 108198515 A | 6/2018 |

(Continued)

OTHER PUBLICATIONS

CN Office Action dated Mar. 7, 2022 for CN Application No. 202010242264.
(Continued)

*Primary Examiner* — Michael N Orlando
*Assistant Examiner* — Joshel Rivera
(74) *Attorney, Agent, or Firm* — Workman Nydegger (57) ABSTRACT

A bonding method and a bonding device for a flexible panel. In the process of bonding a protective cover plate and the flexible panel, a heated-type optical adhesive is used, the optical adhesive at normal temperature has relatively low viscosity and the viscosity thereof is below a bondable threshold, so that before the flexible panel and the edge of
(Continued)

the protective cover plate are bonded, the optical adhesive and the edge of the protective cover plate come into contact in advance and then can be effectively separated, thus poor bonding in a bending region is avoided, the risk of generating bubbles and cracks is small, and the bonding yield can be improved. Moreover, the optical adhesive is increased in viscosity after heated, thereby ensuring that the flexible panel is bonded to the protective cover plate.

13 Claims, 5 Drawing Sheets (51) Int. Cl.
  *B32B 17/06* (2006.01)
  *B32B 37/00* (2006.01)
  *B32B 37/12* (2006.01)
  *B32B 37/22* (2006.01)
  *H10K 50/84* (2023.01)
  *H10K 71/00* (2023.01)
  *H10K 71/50* (2023.01)
  *H10K 77/10* (2023.01)
  *H10K 102/00* (2023.01)

(52) U.S. Cl.
  CPC .......... *B32B 37/1284* (2013.01); *B32B 37/22* (2013.01); *B32B 41/00* (2013.01); *H10K 50/841* (2023.02); *H10K 71/00* (2023.02); *H10K 71/50* (2023.02); *H10K 77/111* (2023.02); *B32B 2457/206* (2013.01); *H10K 2102/311* (2023.02)

(58) Field of Classification Search
  CPC .......... B32B 2457/206; B32B 38/1866; B32B 37/12; B32B 37/06; B32B 2457/20; H10K 50/841; H10K 71/00; H10K 71/50; H10K 77/111; H10K 2102/311; H10K 50/8426; H10K 59/00; G09F 9/30; G09F 9/301
  USPC .................... 156/60, 64, 350, 351, 378, 379
  See application file for complete search history.

(56) References Cited

FOREIGN PATENT DOCUMENTS

| | | | |
|---|---|---|---|
| CN | 108648621 | A | 10/2018 |
| CN | 108715076 | A | 10/2018 |
| CN | 109648979 | A | 4/2019 |
| CN | 109795201 | A | 5/2019 |
| CN | 110760270 | A | 2/2020 |
| CN | 110930882 | A | 3/2020 |
| JP | 2017-056613 | A | 3/2017 |
| KR | 10-2019-0011397 | A | 2/2019 |

OTHER PUBLICATIONS

International Search Report and Written Opinion received for PCT Patent Application No. PCT/CN2021/074935, dated Apr. 30, 2021, 10 pages (2 pages of English Translation and 8 pages of Original Document).

* cited by examiner

BONDING METHOD AND BONDING DEVICE FOR FLEXIBLE PANEL

CROSS-REFERENCE TO RELATED APPLICATION

This application is a National Stage of International Application No. PCT/CN2021/074935, filed Feb. 2, 2021, which claims priority to Chinese Patent Application No. 202010242264.3, filed Mar. 31, 2020, both of which are hereby incorporated by reference in their entireties.

FIELD

The present disclosure relates to the technical field of display, in particular to a bonding method and bonding device for a flexible panel.

BACKGROUND

At present, an OLED flexible panel has been widely applied to various electronic product as a display component of an electronic device. With development of a curved screen, a length of an arc region of a glass cover plate outside an OLED module gets larger and larger, which puts forward a higher requirement for a full-bonding method of the glass cover plate and a flexible OLED. An existing vacuum bonding technology only meets a requirement of bonding of a small-arc-length glass cover plate and a display panel, and there is a lack of a corresponding solution to a mode of bonding of a large-radian glass cover plate and the display panel, especially to a 180°-inverted bonding mode.

SUMMARY

An embodiment of the present disclosure provides a bonding method of a flexible panel, including:
fixing a protective cover plate into an accommodation space of a bonding jig;
putting a flexible panel with an optical clear adhesive onto a carrier film, wherein a viscosity of the optical clear adhesive in a normal temperature is less than a bondable threshold, the optical clear adhesive is on a surface of the flexible panel; and
controlling a sliding block carrying the carrier film to move in the accommodation space in a set bonding direction, controlling a driving part to drive the flexible panel on the carrier film to form a shape matched with the protective cover plate, and bonding the flexible panel to the protective cover plate through heating the optical clear adhesive, wherein a viscosity of the heated optical clear adhesive is greater than the bondable threshold.

In some embodiments, the optical clear adhesive is heated by heating the sliding block.

In some embodiments, the optical clear adhesive is heated in a mode of heating a part of the bonding jig bonded to the optical clear adhesive.

In some embodiments, before the flexible panel is bonded to the protective cover plate, the optical clear adhesive is heated.

In some embodiments, a heating temperature of the optical clear adhesive is 50-60° C.

In some embodiments, the viscosity of the optical clear adhesive in the normal temperature is less than 100 g/inch, and the viscosity of the heated optical clear adhesive is larger than 2000 g/inch.

In some embodiments, the protective cover plate includes a main body portion and two bending portions located at two ends of the main body portion, the bonding jig includes a first partition and two second partitions located at two ends of the first partition, and the first partition is detachably connected with the two second partitions respectively.

The fixing the protective cover plate into the accommodation space of the bonding jig includes:
disassembling and separating the two second partitions and the first partition of the bonding jig;
matching the main body portion of the protective cover plate with the first partition of the bonding jig in a contact mode; and
covering the two bending portions of the protective cover plate with the two second partitions of the bonding jig respectively, and fixing the two second partitions onto the first partition respectively.

In some embodiments, the controlling the sliding block carrying the carrier film to move in the accommodation space in the set bonding direction includes:
controlling the sliding block to move on the first partition of the bonding jig so as to bond the flexible panel to the main body portion of the protective cover plate; and
controlling the sliding block to move from the first partition of the bonding jig to the second partitions of the bonding jig so as to bond the flexible panel to the bending portions of the protective cover plate.

In some embodiments, the controlling the sliding block to move from the first partition of the bonding jig to the second partitions of the bonding jig includes:
controlling the sliding block to move from the first partition of the bonding jig to the second partition of one side of the bonding jig so as to bond the flexible panel to the bending portion of one side of the protective cover plate; and
controlling the sliding block to move from the second partition of the side of the bonding jig to, after passing through the first partition, the second partition of the other side of the bonding jig so as to bond the flexible panel to the bending portion of the other side of the protective cover plate.

In some embodiments, the controlling the driving part to drive the flexible panel on the carrier film to form the shape matched with the protective cover plate includes:
controlling the driving part to drive an edge of the flexible panel on the carrier film to form a curved surface whose bending degree is larger than that of each of the bending portions when the sliding block moves from the first partition of the bonding jig to the second partitions of the bonding jig.

In some embodiments, before controlling the sliding block to move on the first partition of the bonding jig, the first partition of the bonding jig is heated; and
the second partitions of the bonding jig are heated in response to the sliding block being controlled to move from the first partition of the bonding jig to the second partitions of the bonding jig.

In another aspect, an embodiment of the present disclosure further provides a bonding device, applied to the above bonding method provided by embodiments of the present disclosure and including:
a bonding jig configured to fix a protective cover plate, wherein a shape of the bonding jig is same as or similar to a shape of the protective cover plate, the bonding jig is bent so as to form an accommodation space, and the protective cover plate is fixed into the accommodation space;

a carrier film configured to carry a flexible panel with an optical clear adhesive, wherein the optical clear adhesive is on a surface of the flexible panel;

a driving part configured to drive the flexible panel on the carrier film to be matched with the shape of the protective cover plate; and a sliding block configured to carry the carrier film to move in the accommodation space in a set bonding direction.

In some embodiments, the protective cover plate includes a main body portion and two bending portions located at two ends of the main body portion;

the bonding jig includes a first partition and two second partitions located at two ends of the first partition; a shape of the first partition is the same as or similar to a shape of the main body portion of the protective cover plate, and shapes of the two second partitions are the same as or similar to shapes of the two bending portions of the protective cover plate respectively; and the first partition is detachably connected with the two second partitions respectively.

In some embodiments, the main body portion includes a flat panel region and two ¼ arc bending regions located at two ends of the flat panel region respectively, each of the bending portions includes a ¼ arc bending region, the ¼ arc bending regions of the bending portions are connected with the ¼ arc bending regions of the main body portion to form 180-degree bending between the main body portion and the bending portions.

In some embodiments, the carrier film includes a stretching portion exceeding an edge of the flexible panel; and the driving part includes a clamp and a roller shaft, the clamp is configured to clamp an edge of the stretching portion, the roller shaft is configured to support the stretching portion and change a shape of the stretching portion so as to change a bending degree of the edge of the flexible panel.

In some embodiments, the sliding block includes a platy carrying portion and a rod-shaped supporting portion, the platy carrying portion is fixedly connected with the rod-shaped supporting portion, the platy carrying portion is configured to carry the carrier film, the rod-shaped supporting portion is configured to support the platy carrying portion, and a shape of a section, perpendicular to a carrying surface of the platy carrying portion, of the sliding block is a "T" shape.

DETAILED DESCRIPTION OF THE EMBODIMENTS

At present, after fabrication of a flexible OLED display panel is completed, a protective cover plate needs to be bonded to an outer side of a display screen of the flexible OLED display panel so as to protect the OLED display panel. In order to realize 3D display of the OLED display panel, an edge end surface of the OLED display panel is usually set to be an arc surface, so during displaying, an image of an edge region of the OLED display panel can also be normally displayed, and thus an edge end surface of the protective cover plate is usually set to be an arc. surface.

Figure 1:
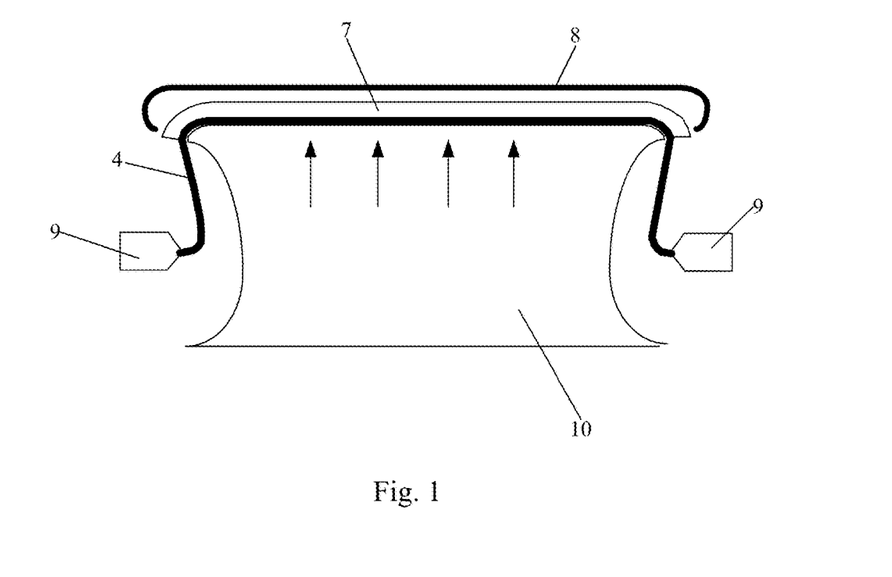
FIG. 1 is a schematic structural diagram of a bonding device in the related art.

Bonding of the flexible OLED display panel and the protective cover plate is usually realized through a bonding jig. An existing bonding jig may be set to be of an integrated blocky structure, as shown in FIG. 1, its carrying surface is configured to carry a carrier film 4, and the carrier film 4 is configured to carry the flexible OLED display panel 7. During bonding, the blocky structure 10 moves upwards to approach to the protective cover plate 8, a clamping structure 9 clamps the carrier film 4 to realize profiling of the flexible OLED display panel 7, that is, a shape of the flexible OLED display panel 7 is similar to that of the protective cover plate 8, and thus the flexible OLED display panel 7 is bonded to the protective cover plate 8 in whole.

As shown in FIG. 1, during upwards movement and bonding of the blocky structure 10, a movement space of the clamping structure 9 during assistance in profiling is quite limited, which tends to cause incomplete profiling of the flexible OLED display panel 7, the flexible OLED display panel makes contact with an edge of the protective cover plate 8 in advance, consequently, the flexible OLED display panel 7 is too tight or too loose during bonding, bubbles are prone to occurring between the flexible OLED display panel 7 and the protective cover plate 8 if the flexible OLED display panel 7 is too loose, the flexible OLED display panel 7 is prone to cracking and damage if the flexible OLED display panel 7 is too tight, and bonding quality of the flexible OLED display panel 7 and the protective cover plate 8 is severely affected.

Besides, during bonding of a large-radian curved protective cover plate and a flexible substrate, as the OLED display panel 7 is affected by stress, a phenomenon of advanced contact of optical clear adhesive (OCA) and the edge of the protective cover plate 8 will occur inevitably during bonding of bending portions, once they make contact, effective separation and again bonding fail, consequently, bonding of the bending regions is incomplete, and unfavorable problems such as bubbles/folds may occur.

In order to solve a problem of a low bonding yield between the large-radian curved protective cover plate and the flexible substrate, embodiments of the present disclosure provide a bonding method and bonding device for a flexible panel. In order to make objectives, technical solutions and advantages of the present disclosure clearer, specific implementations of the bonding method and the bonding device for the flexible panel provided by the embodiments of the present disclosure are described in detail below with reference to the accompanying drawings. It should be understood that preferred embodiments described below are only used for explaining and setting forth the present disclosure instead of limiting the present disclosure. Besides, without a conflict, the embodiments and features in the embodiments of the present disclosure may be combined mutually.

Shapes and sizes of all components in the drawings do not reflect a true scale, but only intend to illustrate contents of the present disclosure.

Figure 2:
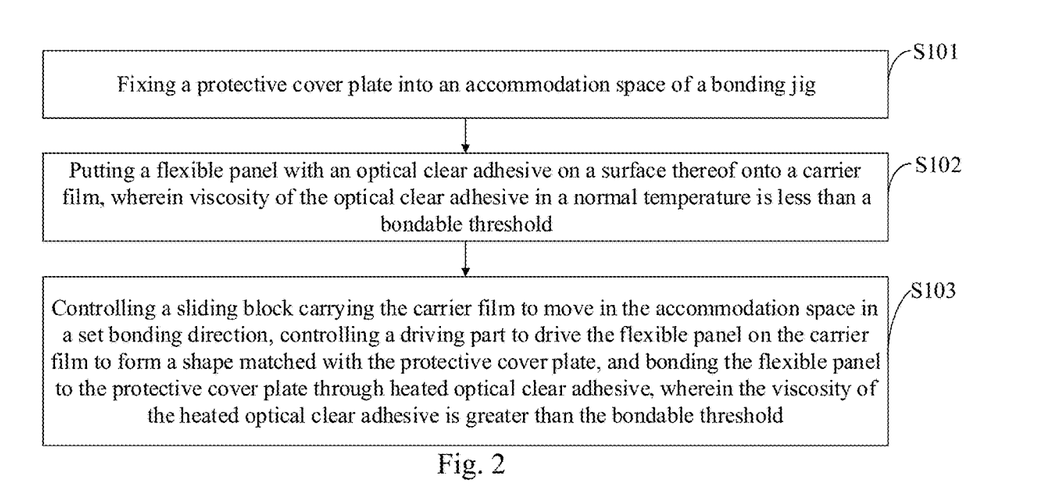
FIG. 2 is a flowchart of a bonding method provided by an embodiment of the present disclosure.

A bonding method for a flexible panel provided by an embodiment of the present disclosure, as shown in FIG. 2, may include the following steps:

S101, a protective cover plate is fixed into an accommodation space of a bonding jig;

S102, the flexible panel with the optical clear adhesive on a surface is put on the carrier film, wherein viscosity of the optical clear adhesive in a normal temperature is less than a bondable threshold; and S103, a sliding block carrying the carrier film is controlled to move in the accommodation space in a set bonding direction, meanwhile, a driving part is controlled to drive the flexible panel on the carrier film to form a shape matched with the protective cover plate, and the flexible panel is bonded to the protective cover plate through a heated optical clear adhesive, wherein the viscosity of the heated optical clear adhesive is larger than the bondable threshold.

In some embodiments, during bonding of the protective cover plate and the flexible panel, the heated-type optical clear adhesive is adopted, and the optical clear adhesive has low viscosity in the normal temperature so that a problem of interference during bonding of the flexible panel in bending regions of the protective cover plate can be avoided, that is, a problem that effective separation fails due to advanced contact of the optical clear adhesive with an edge of the protective cover plate, and consequently, defects such as bubbles or folds occur in the bending portions can be avoided. The viscosity of the optical clear adhesive is low in the normal temperature and lower than the bondable threshold, wherein the bondable threshold refers to a numerical value of viscosity of enabling the flexible panel not to be separated from the protective cover plate after contact, so before the flexible panel is bonded to the edge of the protective cover plate, effective separation can be realized after the optical clear adhesive and the edge of the protective cover plate make contact in advance, bonding defects in the bending regions are avoided, a risk of generating the bubbles and cracks is small, and a bonding yield can be improved. The viscosity of the heated optical clear adhesive is improved so that it can be guaranteed that the flexible panel is bonded to the protective cover plate. Besides, the above bonding method can be applied to full bonding between the flexible panel and a large-radian protective cover plate, especially to bonding of a 180°-inverted protective cover plate.

In some embodiments, the optical clear adhesive can be heated by heating the sliding block.

In some embodiments, the optical clear adhesive can be heated in a mode of locally heating the bonding jig bonded to the optical clear adhesive.

In some embodiments, the optical clear adhesive can be heated before the flexible panel is bonded to the protective cover plate. In some embodiments, when the optical clear adhesive is heated in a mode of heating the sliding block, the sliding block can be heated before the carrier film carried by the sliding block is bonded to the protective cover plate in the accommodation space, so that the optical clear adhesive on the surface of the flexible panel located on the carrier film is heated through an action of hear conduction. When the optical clear adhesive is heated in a mode of locally heating the bonding jig, a region to which the bonding jig corresponds can be heated before the carrier film carried by the sliding block is bonded to the protective cover plate in the accommodation space, so that the protective cover plate is heated through the action of heat conduction and then the optical clear adhesive which is about to make contact with the protective cover plate is heated.

In some embodiments, the optical clear adhesive can be heated while the flexible panel is bonded to the protective cover plate, which is not limited herein. In some embodiments, when the optical clear adhesive is heated in a mode of heating the sliding block, the sliding block can be heated while the carrier film carried by the sliding block is bonded to the protective cover plate in the accommodation space, so that the optical clear adhesive on the surface of the flexible panel located on the carrier film can be heated through the action of heat conduction. When the optical clear adhesive is heated in a mode of locally heating the bonding jig, the region to which the bonding jig corresponds can be heated while the carrier film carried by the sliding block is bonded to the protective cover plate, so that the protective cover plate is heated through the action of heat conduction and then the optical clear adhesive in contact with the protective cover plate is heated.

In some embodiments, a heating temperature of the optical clear adhesive may be controlled to be 50-60° C., so that it is guaranteed that the heated optical clear adhesive can have larger viscosity to fix the flexible panel onto the protective cover plate, and moreover, a film layer function on the flexible panel can be prevented from being damaged due to a high temperature.

In some embodiments, the viscosity of the optical clear adhesive in the normal is generally less than 100 g/inch, so that it is guaranteed that effective separation can be realized though the optical clear adhesive and the edge of the protective cover plate make contact in advance; and the viscosity of the heated optical clear adhesive is generally greater than 2000 g/inch, so that it is guaranteed that the heated optical clear adhesive can effectively bond the protective cover plate to the flexible panel.

Figure 6:
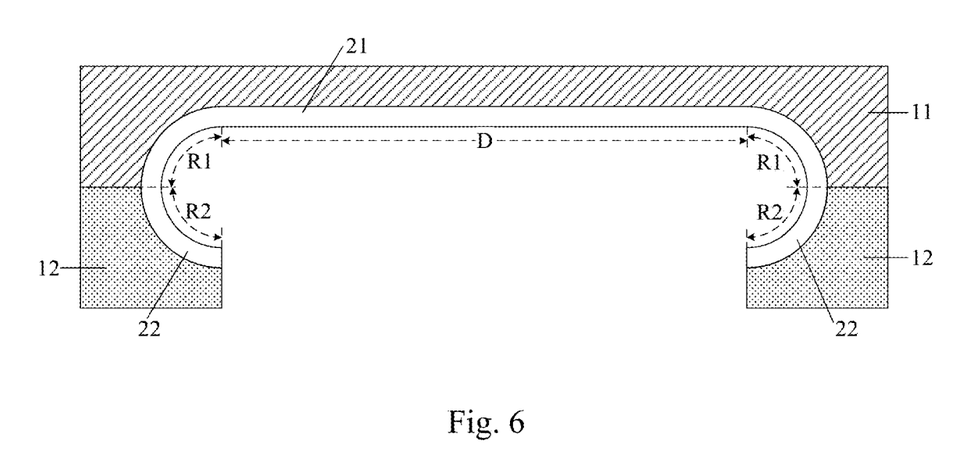
FIG. 6 is a schematic structural diagram of a bonding jig in a bonding device provided by an embodiment of the present disclosure.

In some embodiments, as shown in FIG. 6, the protective cover plate 2 may include a main body portion 21 and two bending portions 22 located at two ends of the main body portion 21, correspondingly, the bonding jig 1 may include a first partition 11 and two second partitions 12 located at two ends of the first partition 11, and the first partition 11 is detachably connected with the two second partitions 12 respectively.

Figure 3:
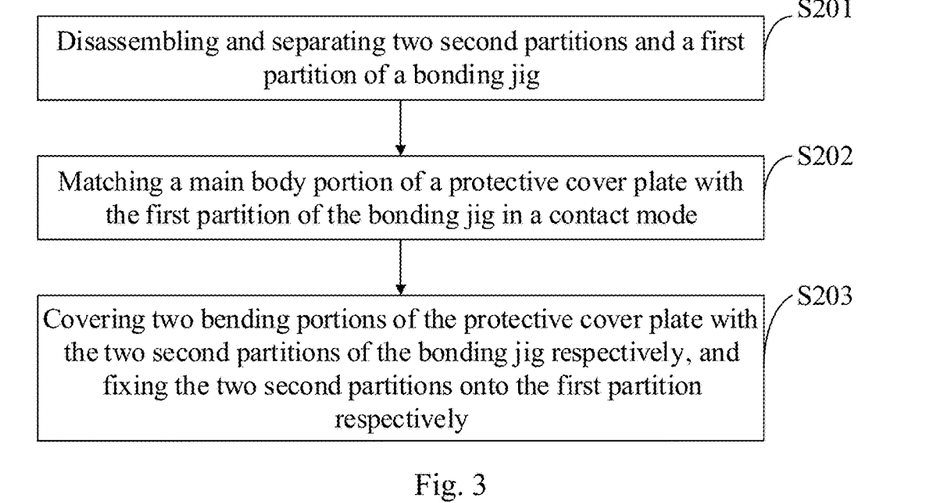
FIG. 3 is a flowchart of a bonding method provided by an embodiment of the present disclosure.

The step S101 that the protective cover plate is fixed into the accommodation space of the bonding jig, as shown in FIG. 3, may include:

S201, the two second partition of the bonding jig are separated from its first partition;

S202, the main body portion of the protective cover plate is matched with the first partition of the bonding jig in a contact mode; and S203, the two bending portions of the protective cover plate are covered with the two second partitions of the bonding jig respectively, and the two second partitions are fixedly installed onto the first partition respectively.

In some embodiments, the bonding jig 1 is set as three detachable portions (the first partition 11 and the two second partitions 12 located at the two ends of the first partition 11) so that operations of putting the 180°-inverted protective cover plate 2 in the accommodation space of the bonding jig 1 and fixing the 180°-inverted protective cover plate 2 and the like can be facilitated. Besides, local heating of the bonding jig 1 can be facilitated, that is, when the main body portion 21 of the protective cover plate 2 needs to be bonded to the flexible panel 5, only the first partition 11 of the bonding jig 1 is heated so that effective separation can be realized after the edge of the flexible panel 5 and the bending portions 22 of the protective cover plate 2 make contact in advance.

Figure 4:
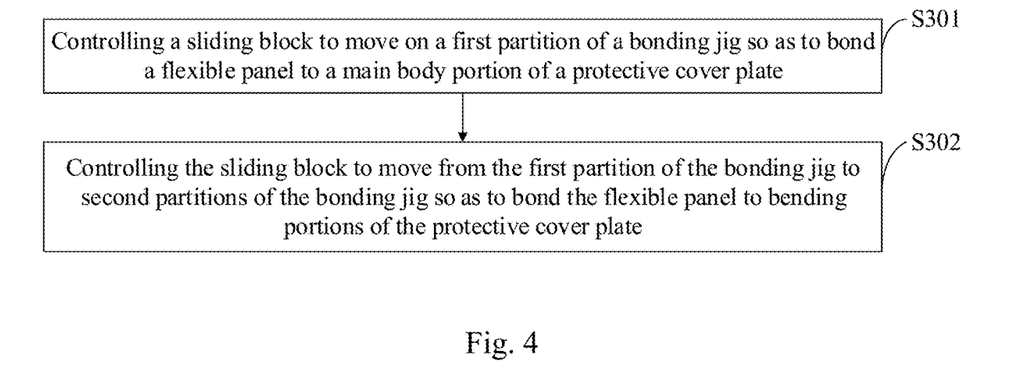
FIG. 4 is a flowchart of a bonding method provided by an embodiment of the present disclosure.
Figure 5A:
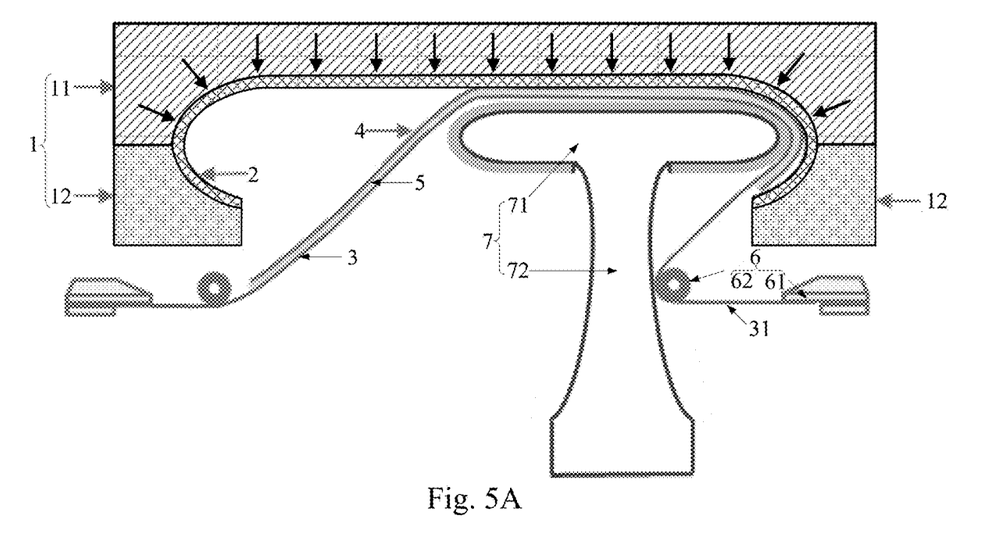
FIG. 5A is a schematic structural diagram of a bonding device provided by an embodiment of the present disclosure during use.

In some embodiments, the above step S103 that the sliding block carrying the carrier film is controlled to move in the accommodation space in the set bonding direction, as shown in FIG. 4, may include:

S301, the sliding block is controlled to move on the first partition of the bonding jig so as to bond the flexible panel to the main body portion of the protective cover plate, as shown in FIG. 5A, the sliding block can be controlled to move in a center region of the first partition of the bonding jig firstly and then to slide to an edge region form the center region; and S302, the sliding block is controlled to move from the first partition of the bonding jig to the second partitions of the bonding jig so as to bond the flexible panel to the bending portions of the protective cover plate.

In some embodiments, during bonding, firstly, the flexible panel is bonded to the main body portion of the protective cover plate, and then the flexible panel is bonded to the bending portions of the protective cover plate. That is, firstly, the flexible panel is bonded to a non-bending portion of the protective cover plate so that the flexible panel can be conveniently fixed onto the protective cover plate, and then bonding is made extending from the non-bending portion to the edge bending portions, so that a bonding process is conveniently controlled precisely, the flexible panel is prevented from generating the bubbles or being damaged during bonding, and bonding quality is improved.

Figure 5B:
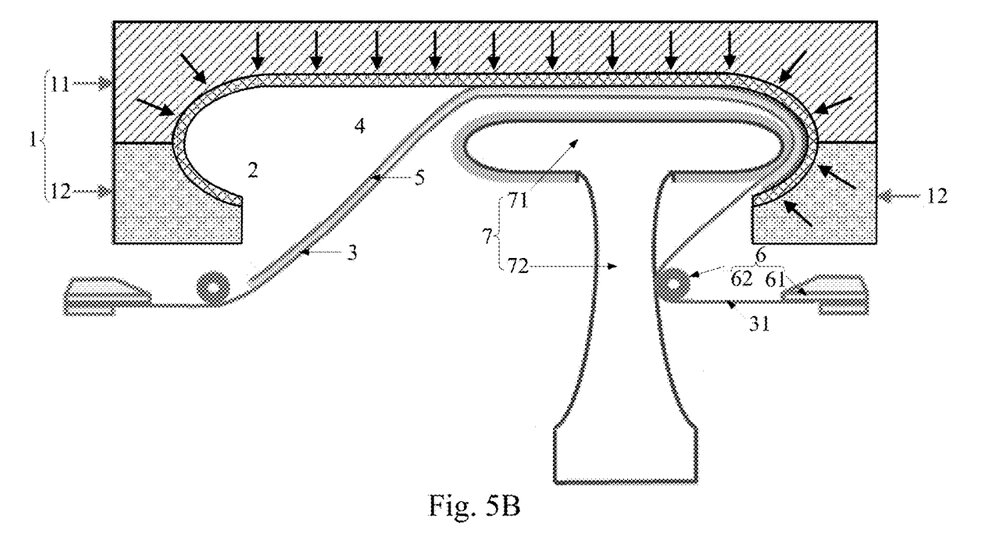
FIG. 5B is a schematic structural diagram of a bonding device provided by an embodiment of the present disclosure during use.
Figure 5C:
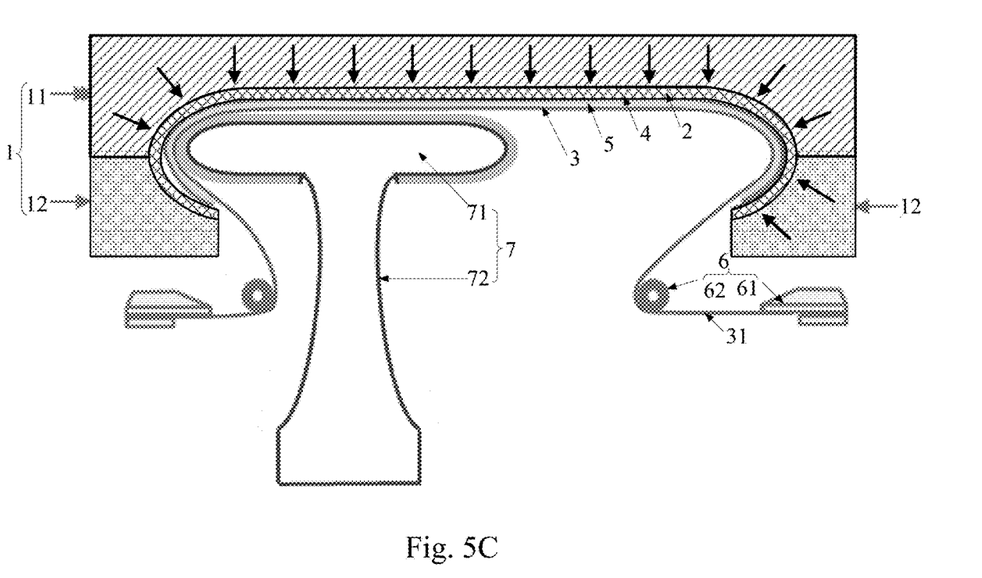
FIG. 5C is a schematic structural diagram of a bonding device provided by an embodiment of the present disclosure during use.
Figure 5D:
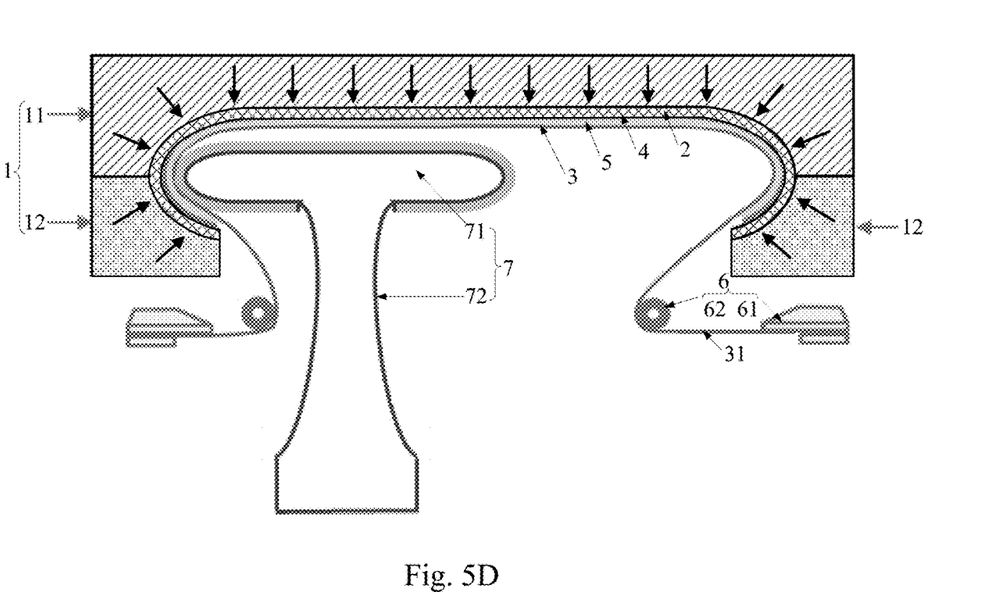
FIG. 5D is a schematic structural diagram of a bonding device provided by an embodiment of the present disclosure during use.

In some embodiments, when there is one sliding block, the above step S302 that the sliding block is controlled to move from the first partition of the bonding jig to the second partitions of the bonding jig may include:

firstly, the sliding block is controlled to move from the first partition of the bonding jig to the second partition of one side of the bonding jig so as to bond the flexible panel to the bending portion of one side of the protective cover plate, as shown in FIG. 5B; and then the sliding block is controlled to move from the second partition of the side of the bonding jig to, after passing through the first partition (as shown in FIG. 5C), the second partition of the other side of the bonding jig, as shown in FIG. 5D, so as to bond the flexible panel to the bending portion of the other side of the protective cover plate.

In some embodiments, one sliding block is adopted, as shown in FIG. 5A, the sliding block slides on the first partition of the bonding jig for bonding, then slides to the second partition of one side, as shown in FIG. 5B, for completing bonding of the bending portion of one side, as shown in FIG. 5C, and then passes through the first partition to slide to the second partition of the other side for completing bonding of the bending portion of the other side, as shown in FIG. 5D, so that a sliding trajectory of the sliding block can be controlled precisely and then the bonding quality can be conveniently controlled precisely.

Alternatively, when there are two sliding blocks, the above step S302 that the sliding blocks are controlled to move from the first partition of the bonding jig to the second partitions of the bonding jig may include: the two sliding blocks are controlled at the same time to move from the first partition of the bonding jig to the second partition of one side of the bonding jig respectively so as to bond the flexible panel to the bending portions of the two sides of the protective cover plate.

In some embodiments, the two sliding blocks slide on the first partition of the bonding jig for bonding and then slide to the second partitions of the two sides at the same time for completing bonding of the bending portions of the two sides so that bonding time can be shortened and time cost can be reduced.

In some embodiments, the above step S103 that the driving part is controlled to drive the flexible panel on the carrier film to form the shape matched with the protective cover plate may include:

when the sliding block moves from the first partition of the bonding jig to the second partitions of the bonding jig, the driving part is controlled to drive an edge of the flexible panel on the carrier film to form a curved surface whose bending degree is greater than that of each of the bending portions so that the optical clear adhesive can be prevented from making contact with the edge of the protective cover plate in advance as much as possible.

In some embodiments, before the sliding block is controlled to move on the first partition of the bonding jig, the first partition of the bonding jig can be heated, as shown by an arrow in FIG. 5A, so that when the sliding block moves on the first partition of the bonding jig, the heated optical clear adhesive can directly bond the flexible panel to a region to which the protective cover plate corresponds; and when the sliding block is controlled to move from the first partition of the bonding jig to the second partitions of the bonding jig, as shown by arrows in FIG. 5B and FIG. 5D, the second partitions of the bonding jig are heated so that when the sliding block moves on the second partitions of the bonding jig, the heated optical clear adhesive can directly bond the flexible panel to the region to which the protective cover plate corresponds.

Based on the same inventive concept, an embodiment of the present disclosure provides a bonding device, applied to the above bonding method provided by the embodiment of the present disclosure. The bonding device, as shown in FIG. 5A to FIG. 5D, includes:

a bonding jig 1, configured to fix a protective cover plate 2, wherein a shape of the bonding jig 1 is the same as or similar to a shape of the protective cover plate 2, the bonding jig 1 is bent to form an accommodation space, and the protective cover plate 2 is fixed into the accommodation space, in some embodiments, the protective cover plate 2 may be a glass cover plate;

a carrier film 3, configured to carry a flexible panel 5 with an optical clear adhesive 4 on a surface;

a driving part 6, configured to drive the flexible panel 5 on the carrier film 3 to be matched with the shape of the protective cover plate 2; and a sliding block 7, configured to carry the carrier film 3 to move in the accommodation space in a set bonding direction.

In some embodiments, the bonding jig 1, the driving part 6 and the sliding block 7 may be installed at a bottom of a vacuum cavity, and the carrier film 3 is put on the sliding block 7 and its two ends are fixed to the driving part 6.

In some embodiments, the bonding device cooperates with the above bonding method for use, during bonding of the protective cover plate 2 and the flexible panel 5, the heated-type optical clear adhesive 4 is adopted, and the optical clear adhesive 4 has low viscosity in the normal temperature, so a problem of interference during bonding of bending regions of the protective cover plate 2 and the flexible panel 5 can be avoided, that is, a problem that effective separation fails due to advanced contact of the optical clear adhesive 4 and the edge of the protective cover plate 2, and consequently defects such as bubbles or folds are generated in the bending regions can be avoided. The viscosity of the optical clear adhesive 4 is low in the normal temperature and lower than a bondable threshold, wherein the bondable threshold refers to a numerical value of viscosity of enabling the flexible panel 5 not to be separated from the protective cover plate 2 after contact, so before the flexible panel 5 is bonded to the edge of the protective cover plate 2, effective separation can be realized after the optical clear adhesive 4 and the edge of the protective cover plate 2 make contact in advance, bonding defects in the bending regions are avoided, a risk of generating the bubbles and cracks is small, and a bonding yield can be improved. The viscosity of the heated optical clear adhesive 4 is improved so that it can be guaranteed that the flexible panel 5 is bonded to the protective cover plate 2. Besides, the above bonding device can be applied to full bonding between the flexible panel 5 and a large-radian protective cover plate 2, especially to bonding of the 180°-inverted protective cover plate 2.

In some embodiments, as shown in FIG. 6, the protective cover plate 2 may include a main body portion 21 and two bending portions 22 located at two ends of the main body portion 21.

Correspondingly, the bonding jig 1 includes a first partition 11 and two second partitions 12 located at two ends of the first partition 11. A shape of the first partition 11 is the same as or similar to a shape of the main body portion 21 of the protective cover plate 2, shapes of the two second partitions 12 are the same as or similar to those of the two bending portions 22 of the protective cover plate 2 respectively, and the first partition 11 is detachably connected with the two second partitions 12 respectively.

In some embodiments, the shape of the bonding jig 1 is consistent with the shape of the protective cover plate 2 so that a good fixing effect of the protective cover plate 2 can be realized, supporting can be provided for the protective cover plate 2, and cracking of the protective cover plate 2 due to pressure of a bonding process is avoided. The bonding jig 1 is set as three detachable portions (the first partition 11 and the two second partitions 12 located at the two ends of the first partition 11) so that operations of putting the protective cover plate 2 in the accommodation space of the bonding jig 1 and fixing the protective cover plate 2 and the like can be facilitated. Besides, local heating of the bonding jig 1 can be facilitated, that is, when the main body portion 21 of the protective cover plate 2 needs to be bonded to the flexible panel 5, only the first partition 11 of the bonding jig 1 is heated so that effective separation can be realized after the edge of the flexible panel 5 and the bending portions 22 of the protective cover plate 2 make contact in advance.

In some embodiments, as shown in FIG. 6, the main body portion 21 may include a flat panel region D and two ¼ arc bending region R1 located at two ends of the flat panel region D respectively, each of the bending portions 22 includes a ¼ arc bending region R2, the ¼ arc bending regions R2 of the bending portions 22 are connected with the ¼ arc bending regions R1 of the main body portion 21 to form 180-degree bending between the main body portion 21 and the bending portions 22. In other words, the protective cover plate 2 is in a shape of 180-degree bending of the two ends, its bending portion is in a semicircle shape, and the main body portion 21 and the bending portions 22 partition the semicircle bending portion evenly and each have the ¼ arc bending region. Correspondingly, arrangement of the first partition 11 and the two second partitions 12 of the bonding jig 1 is the same as arrangement of the main body portion 21 and the two bending portions 22 of the protective cover plate 2.

In some embodiments, during operation of the fixing the protective cover plate 2, the two second partitions of the first partition 11 of the bonding jig 1 can be disassembled and separated firstly, then the main body portion 21 of the protective cover plate 2 is matched with the first partition 11 of the bonding jig 1 in a contact mode, then the two bending portions 22 of the protective cover plate 2 are covered with the two second partitions 12 of the bonding jig 1 respectively, the two second partitions 12 are fixedly installed onto the first partition 11 respectively, and thus at the moment, fixing the protective cover plate 2 into the accommodation space of the bonding jig 1 can be realized.

In some embodiments, as shown in FIG. 5A to FIG. 5D, the carrier film 3 may include a stretching portion 31 exceeding the edge of the flexible panel 5.

The driving part 6 may include a clamp 61 and a roller shaft 62, the clamp 61 is configured to clamp an edge of the stretching portion 31, and the roller shaft 62 is configured to support the stretching portion 31 and change a shape of the stretching portion 31 so as to change a bending degree of the edge of the flexible panel 5.

In some embodiments, an extending direction of the roller shaft 62 is consistent with an extending direction of the edge of the stretching portion 31. The clamp 61 has a certain width in the extending direction of the edge of the stretching portion 31 and can clamp a wider segment of edge in the extending direction of the edge of the stretching portion 31 so that a tensile force acting on the stretching portion 31 can be uniformly distributed and an acting effect is good. The driving part 6 may further include a servo motor, and the servo motor can be in transmission connection with the clamp 61 so as to drive the clamp 61 to stretch the edge of the stretching portion 31 of the carrier film 3. As shown in FIG. 5A to FIG. 5D, taking an orientation in FIG. 5A to FIG. 5D for example, the carrier film 3 is attached to one side of the flexible panel 5 and put on the sliding block 7 together with the flexible panel 5, the stretching portion 31 of the carrier film 3 can downwards stretch bypassing the roller shaft 62, the edge of the stretching portion 31 is clamped with the clamp 61, the clamp 61 can be connected with the servo motor, the servo motor drives the clamp 61 to stretch the edge of the stretching portion 31, and under the action of the tensile force, the carrier film 3 can change in bending shape and drive to change the bending degree of the edge of the flexible panel 5.

In some embodiments, as shown in FIG. 5A to FIG. 5D, the sliding block 7 includes a platy carrying portion 71 and a rod-shaped supporting portion 72, the platy carrying portion 71 is fixedly connected with the rod-shaped supporting portion 72, the platy carrying portion 71 is configured to carry the carrier film 3, the rod-shaped supporting portion 72 is configured to support the platy carrying portion 71, and a shape of a section, perpendicular to a carrying surface of the platy carrying portion 71, of the sliding block 7 is a "T" shape.

In some embodiments, the shape of the section of the platy carrying portion 71 and the rod-shaped supporting portion 72 is the "T" shape, compared with an existing blocky structure, a movement adjustment space of the driving part 6 can be increased in a profiling bonding process of the flexible panel 5 and the protective cover plate 2, so that profiling of the flexible panel 5 can be more thorough, the flexible panel 5 can be prevented from making contact with the edge of the protective cover plate 2 in advance as much as possible, thus bubbles or cracking and damage to the flexible panel 5 can be prevented during bonding, and bonding quality of the flexible panel 5 and the protective cover plate 2 is improved.

According to the bonding method and the bonding device for the flexible panel provided by the present disclosure, the heated-type optical clear adhesive is adopted during bonding of the protective cover plate and the flexible panel, the viscosity of the optical clear adhesive is low in the normal temperature and lower than the bondable threshold, so before the flexible panel is bonded to the edge of the protective cover plate, effective separation can be realized after the optical clear adhesive and the edge of the protective cover plate make contact in advance, bonding defects in the bending regions are avoided, a risk of generating the bubbles and cracks is small, and bonding yield can be improved. The viscosity of the heated optical clear adhesive is increased so that it can be guaranteed that the flexible panel is bonded to the protective cover plate. Besides, the above bonding method can be applied to full bonding between the flexible panel and the large-radian protective cover plate, especially to bonding of the 180°-inverted protective cover plate.

Obviously, those skilled in the art can make various changes and transformations for the present disclosure without departing from the spirit and scope of the present disclosure. In this case, if these changes and transformations of the present disclosure fall within the scope of the claims and their equivalents of the present disclosure, the present disclosure also intends to contain these changes and transformations.

What is claimed is:

1. A bonding method for a flexible panel, comprising:
    fixing a protective cover plate into an accommodation space of a bonding jig;
    putting a flexible panel with an optical clear adhesive onto a carrier film, wherein a peeling force of the optical clear adhesive in a normal temperature is less than a bondable threshold, the optical clear adhesive is on a surface of the flexible panel; and
    controlling a sliding block carrying the carrier film to move in the accommodation space in a set bonding direction, while controlling a driving part to drive the flexible panel on the carrier film to form a shape matched with the protective cover plate, and bonding the flexible panel to the protective cover plate through heating the optical clear adhesive, wherein a peeling force of the heated optical clear adhesive is greater than the bondable threshold;
    wherein the protective cover plate comprises a main body portion and two bending portions located at two ends of the main body portion, the main body portion comprises a flat panel region and two ¼ arc bending regions located at two ends of the flat panel region respectively, each bending portion comprises a ¼ arc bending region, and the ¼ arc bending regions of the bending portions are connected with the ¼ arc bending regions of the main body portion to form 180-degree bending between the main body portion and the bending portions; and the bonding jig comprises a first partition and two second partitions located at two ends of the first partition;
    the controlling the sliding block carrying the carrier film to move in the accommodation space in the set bonding direction comprises:
        controlling the sliding block to move on the first partition of the bonding jig so as to bond the flexible panel to the main body portion of the protective cover plate; and
        controlling the sliding block to move from the first partition of the bonding jig to the second partitions of the bonding jig to curve the flexible panel so as to bond the flexible panel to the bending portions of the protective cover plate; and
    the controlling the driving part to drive the flexible panel on the carrier film to form the shape matched with the protective cover plate comprises:
        controlling the driving part to drive an edge of the flexible panel on the carrier film to form a curved surface whose bending degree is greater than that of each of the bending portions when the sliding block moves from the first partition of the bonding jig to the second partitions of the bonding jig.

2. The bonding method according to claim 1, wherein the optical clear adhesive is heated by heating the sliding block.

3. The bonding method according to claim 1, wherein the optical clear adhesive is heated in a mode of heating a part of the bonding jig bonded to the optical clear adhesive.

4. The bonding method according to claim 2, wherein before the flexible panel is bonded to the protective cover plate, the optical clear adhesive is heated.

5. The bonding method according to claim 1, wherein a heating temperature of the optical clear adhesive is 50-60° C.

6. The bonding method according to claim 5, wherein the peeling force of the optical clear adhesive in the normal temperature is less than 100 gf/inch, and the peeling force of the heated optical clear adhesive is greater than 2000 gf/inch.

7. The bonding method according to claim 1, wherein the first partition of the bonding jig is detachably connected with the two second partitions of the bonding jig respectively; and
    the fixing the protective cover plate into the accommodation space of the bonding jig comprises:
        disassembling and separating the two second partitions and the first partition of the bonding jig;
        matching the main body portion of the protective cover plate with the first partition of the bonding jig in a contact mode; and
        covering the two bending portions of the protective cover plate with the two second partitions of the bonding jig respectively, and fixing the two second partitions onto the first partition respectively.

8. The bonding method according to claim 1, wherein the controlling the sliding block to move from the first partition of the bonding jig to the second partitions of the bonding jig comprises:
    controlling the sliding block to move from the first partition of the bonding jig to the second partition of one side of the bonding jig so as to bond the flexible panel to the bending portion of one side of the protective cover plate; and
    controlling the sliding block to move from the second partition of the side of the bonding jig to, after passing through the first partition, the second partition of the other side of the bonding jig so as to bond the flexible panel to the bending portion of the other side of the protective cover plate.

9. The bonding method according to claim 1, wherein before controlling the sliding block to move on the first partition of the bonding jig, the first partition of the bonding jig is heated; and the second partitions of the bonding jig are heated in response to the sliding block being controlled to move from the first partition of the bonding jig to the second partitions of the bonding jig.

10. A bonding device, applied to the bonding method according to claim 1 and comprising:
- a bonding jig configured to fix a protective cover plate, wherein a shape of the bonding jig is same as or similar to a shape of the protective cover plate, the bonding jig is bent so as to form an accommodation space, and the protective cover plate is fixed into the accommodation space;
- a carrier film configured to carry a flexible panel with an optical clear adhesive, wherein the optical clear adhesive is on a surface of the flexible panel;
- a driving part configured to drive the flexible panel on the carrier film to be matched with the shape of the protective cover plate; and
- a sliding block configured to carry the carrier film to move in the accommodation space in a set bonding direction.

11. The bonding device according to claim 10, wherein the protective cover plate comprises a main body portion and two bending portions located at two ends of the main body portion;
- the bonding jig comprises a first partition and two second partitions located at two ends of the first partition; a shape of the first partition is same as or similar to a shape of the main body portion of the protective cover plate, and shapes of the two second partitions are same as or similar to shapes of the two bending portions of the protective cover plate respectively; and the first partition is detachably connected with the two second partitions respectively.

12. The bonding device according to claim 10, wherein the carrier film comprises a stretching portion exceeding an edge of the flexible panel; and
- the driving part comprises a clamp and a roller shaft, the clamp is configured to clamp an edge of the stretching portion, the roller shaft is configured to support the stretching portion and change a shape of the stretching portion so as to change a bending degree of the edge of the flexible panel.

13. The bonding device according to claim 10, wherein the sliding block comprises a platy carrying portion and a rod-shaped supporting portion, the platy carrying portion is fixedly connected with the rod-shaped supporting portion, the platy carrying portion is configured to carry the carrier film, the rod-shaped supporting portion is configured to support the platy carrying portion, and a shape of a section, perpendicular to a carrying surface of the platy carrying portion, of the sliding block is a "T" shape.

\* \* \* \* \*